(12) United States Patent
Huang et al.

(10) Patent No.: US 8,923,071 B2
(45) Date of Patent: Dec. 30, 2014

(54) METHOD OF PROGRAMMING A MULTI-BIT PER CELL NON-VOLATILE MEMORY

(71) Applicant: SKYMEDI Corporation, Hsinchu (TW)

(72) Inventors: Han-Lung Huang, Hsinchu (TW); Ming-Hung Chou, Hsinchu (TW)

(73) Assignee: SKYMEDI Corporation, Hsinchu (TW)

( * ) Notice: Subject to any disclaimer, the term of this patent is extended or adjusted under 35 U.S.C. 154(b) by 0 days.

(21) Appl. No.: 13/903,775

(22) Filed: May 28, 2013

(65) Prior Publication Data

US 2013/0250682 A1    Sep. 26, 2013

Related U.S. Application Data

(62) Division of application No. 13/053,166, filed on Mar. 21, 2011, now Pat. No. 8,472,246.

(51) Int. Cl.
| | | |
|---|---|---|
| *G11C 16/04* | (2006.01) | |
| *G11C 16/10* | (2006.01) | |
| *G11C 11/56* | (2006.01) | |
| *G11C 16/34* | (2006.01) | |
| *G11C 16/26* | (2006.01) | |

(52) U.S. Cl.
CPC .......... *G11C 16/10* (2013.01); *G11C 11/5628* (2013.01); *G11C 16/3454* (2013.01); *G11C 16/26* (2013.01)
USPC ................................ 365/185.28; 365/185.03

(58) Field of Classification Search
CPC ............................. G11C 16/10; G11C 11/5642
USPC ........................................ 365/185.03, 185.28
See application file for complete search history.

(56) References Cited

U.S. PATENT DOCUMENTS

| | | |
|---|---|---|
| 4,748,593 A | 5/1988 | Topich et al. |
| 6,657,891 B1 | 12/2003 | Shibata et al. |
| 7,724,613 B2 | 5/2010 | Bates et al. |
| 2008/0123409 A1* | 5/2008 | Shirakawa ............... 365/185.03 |
| 2008/0181000 A1 | 7/2008 | Lasser |
| 2009/0091991 A1* | 4/2009 | Cho et al. ................. 365/189.16 |
| 2010/0191931 A1 | 7/2010 | Kim |
| 2012/0008387 A1 | 1/2012 | Han-Lung et al. |

* cited by examiner

*Primary Examiner* — Hoai V Ho
(74) *Attorney, Agent, or Firm* — Donald E. Stout; Stout, Uxa & Buyan, LLP

(57) ABSTRACT

A method of programming a multi-bit per cell non-volatile memory is disclosed. In one embodiment, the non-volatile memory is read to obtain a first data of a most-significant-bit (MSB) page on a current word line that succeeds in data reading, wherein the current word line follows a preceding word line on which data reading fails. At least one reference voltage is set. The MSB page on the current word line is secondly programmed with a second data according to the reference voltage, the second data being different from the first data.

11 Claims, 13 Drawing Sheets

| | t1 Read | t2 | t3 | t4 |
|---|---|---|---|---|
| WL0(Block 1st) | | | | |
| WL1 | | | | |
| WL2 | | | | |
| WL3 | | | | |
| ⋮ | | | | |
| WLn | Fail | | | |
| WLn+1 | Fail | | re-read | re-read |
| ⋮ | Fail | re-read | re-program | re-program |
| WLn+1+m | Pass | re-read | | |
| WLn+2+m | Pass | re-program | | |
| ⋮ | | | | |
| WLz(Block last) | | | | |

FIG.5A

| | t1 Read | t2 | t3 | t4 |
|---|---|---|---|---|
| WL0(Block 1st) | | | | |
| WL1 | | | | |
| WL2 | | | | |
| WL3 | | | | |
| ⋮ | | | | |
| WLn | Fail | | | re-read |
| WLn+1 | Fail | | re-read | re-program |
| ⋮ | Fail | re-read | re-program | |
| WLn+1+m(Block last) | Pass | re-program | | |

FIG.5B

|      | Low-bit page(LSB) | High-bit page(MSB) |
|------|-------------------|--------------------|
| WL0  | 00                | 02                 |
| WL1  | 01                | 04                 |
| WL2  | 03                | 06                 |
| WL3  | 05                | 08                 |
| .... |                   |                    |
| WL61 | 79                | 7C                 |
| WL62 | 7B                | 7E                 |
| WL63 | 7D                | 7F                 |

FIG.6

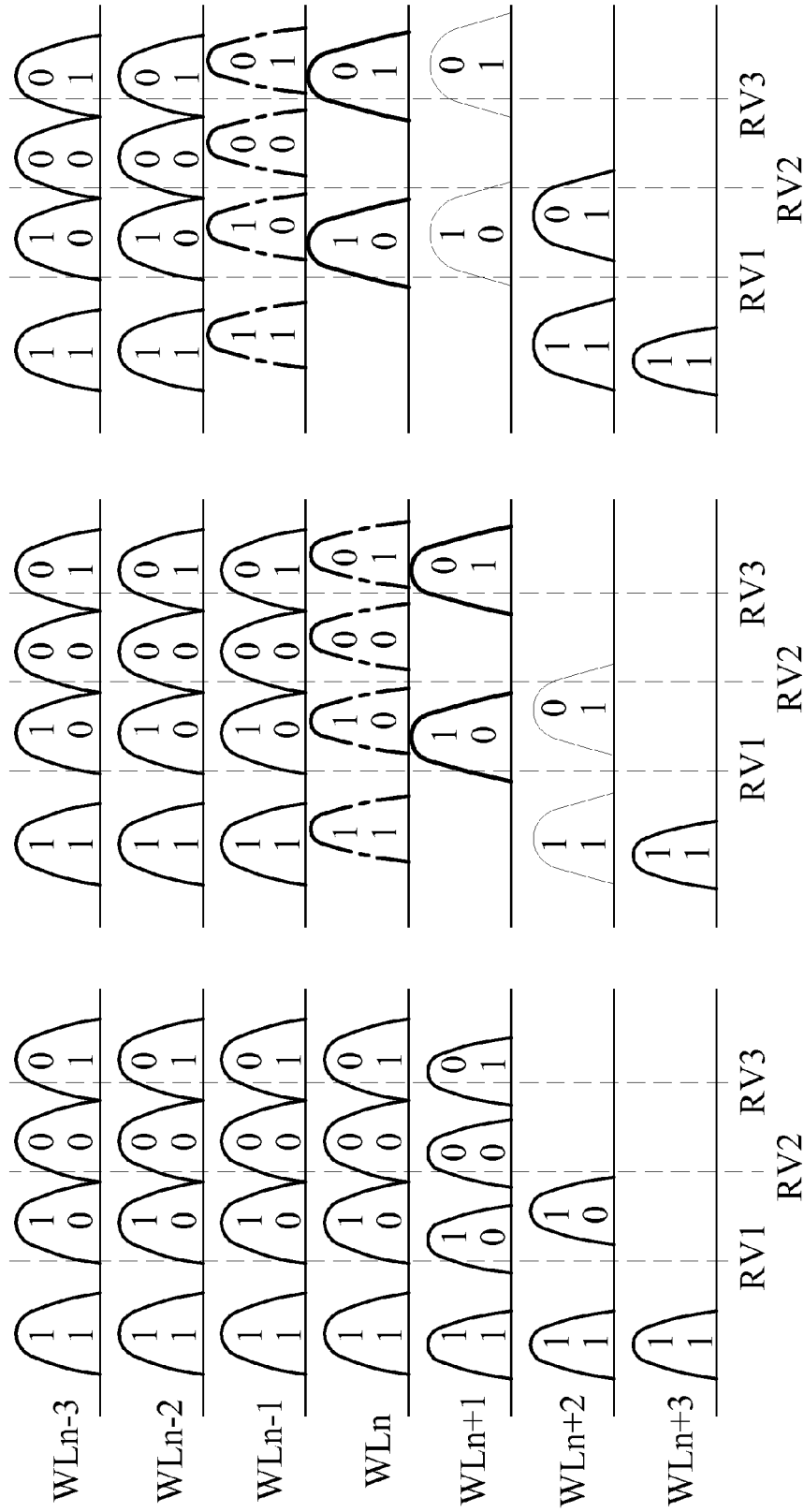

|  | LSB | CSB | MSB |
|---|---|---|---|
| WL0 | 0 | 2 | 5 |
| WL1 | 1 | 4 | 8 |
| WL2 | 3 | 7 | 11 |
| WL3 | 6 | 10 | |
| WL4 | 9 | | |

METHOD OF PROGRAMMING A MULTI-BIT PER CELL NON-VOLATILE MEMORY

CROSS-REFERENCE TO RELATED APPLICATIONS

This application is a divisional of U.S. application Ser. No. 13/053,166, filed on Mar. 21, 2011 and entitled METHOD OF PROGRAMMING A MULTI-BIT PER CELL NON-VOLATILE MEMORY, the entire contents of which are hereby incorporated by reference.

BACKGROUND OF THE INVENTION

1. Field of the Invention

The present invention generally relates to a non-volatile memory, and more particularly to a method of programming a multi-bit per cell non-volatile memory for improving coupling effect.

2. Description of Related Art

Flash memory is a non-volatile solid state memory device that can be electrically erased and reprogrammed. A conventional flash memory stores a single bit of information in each memory cell such that each memory cell can be programmed to assume two possible states. The conventional flash memory is thus commonly referred to as a single-bit per cell flash memory. A modern flash memory is capable of storing two or more bits of information, in each memory cell such that each memory cell can be programmed to assume more than two possible states. The modern flash memory is thus commonly referred to as a multi-bit per cell flash memory.

In the multi-bit per cell flash memory, data of different state are programmed to the flash memory by storing different amount of charge in the floating gate of the flash memory. As the charge in the floating gate specifically determines the corresponding threshold voltage, the data can thus be read from the multi-bit per cell flash memory according to their different threshold voltages. Due to variations among the memory cells during the manufacture or operation, the threshold voltage of each state is not a constant value but a range.

However, the conventional multi-bit per cell flash memory, particularly the three-bit per cell or even, more-bit per cell flash memory, suffers from floating-gate coupling effect and retention effect. As a result, the conventional multi-bit per cell flash memory could probably result in read errors due to narrow read margin, and a need has thus arisen to propose some novel schemes to improve floating-gate coupling effect.

SUMMARY OF THE INVENTION

In view of the foregoing, it is an object of the embodiment of the present invention to provide a method of programming a multi-bit per cell non-volatile memory for improving coupling effect to increase read margin, thereby reducing read errors.

According to one embodiment, a multi-bit per cell non-volatile memory is read to obtain a first data of a most-significant-bit (MSB) page on a current word line that succeeds in data reading, wherein the current word line follows at least one preceding word line on which data reading fails. At least one reference voltage is set. The MSB page on the current line is secondly programmed with a second data according to the reference voltage, the second data being different from the first data.

According to another embodiment, data is read on a current word line on which the data reading fails. At least one neighbor word line is firstly programming, wherein page or pages to be firstly programmed have program sequence numbers after the program sequence number of a failed page of the failed current word line.

According to a further embodiment, a multi-bit per cell non-volatile memory is read to obtain a first data of a most-significant-bit page on at least one neighbor word line that is neighboring to a current word line on which data reading fails. The most-significant-bit page is secondly programmed with a second data on the at least one neighbor word line, the second data being different from the first data.

BRIEF DESCRIPTION OF THE DRAWINGS

FIG. 5A and FIG. 5B show examples associated with the flow of FIG. 4;

FIG. 6 shows a program/read sequence in a memory block for a 2-bit per cell flash memory;

FIG. 7A to FIG. 7C show exemplary threshold voltage distributions of a 2-bit per cell flash memory according to the program/read sequence shown in FIG. 6;

DETAILED DESCRIPTION OF THE INVENTION

Figure 1A:
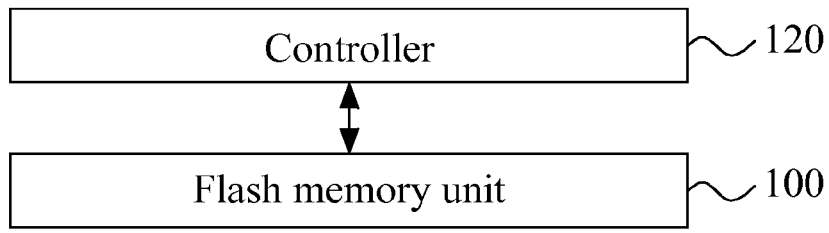
FIG. 1A schematically shows a simplified block diagram of a non-volatile memory system according to one embodiment of the present invention.

FIG. 1A schematically shows a simplified block diagram of a non-volatile memory system such as a flash memory according to one embodiment of the present invention. Other non-volatile memory may, for example, be a phase change memory (PCM) or an electrically erasable programmable read-only memory (EEPROM). In the embodiment, the flash memory includes a flash memory unit 100, particularly a multi-bit per cell NAND flash memory unit. The flash memory system also includes a controller 120 that is capable of twice programming the flash memory unit 100. The controller 120 may be implemented by hardware circuitry, software or their combination.

Figure 1B:
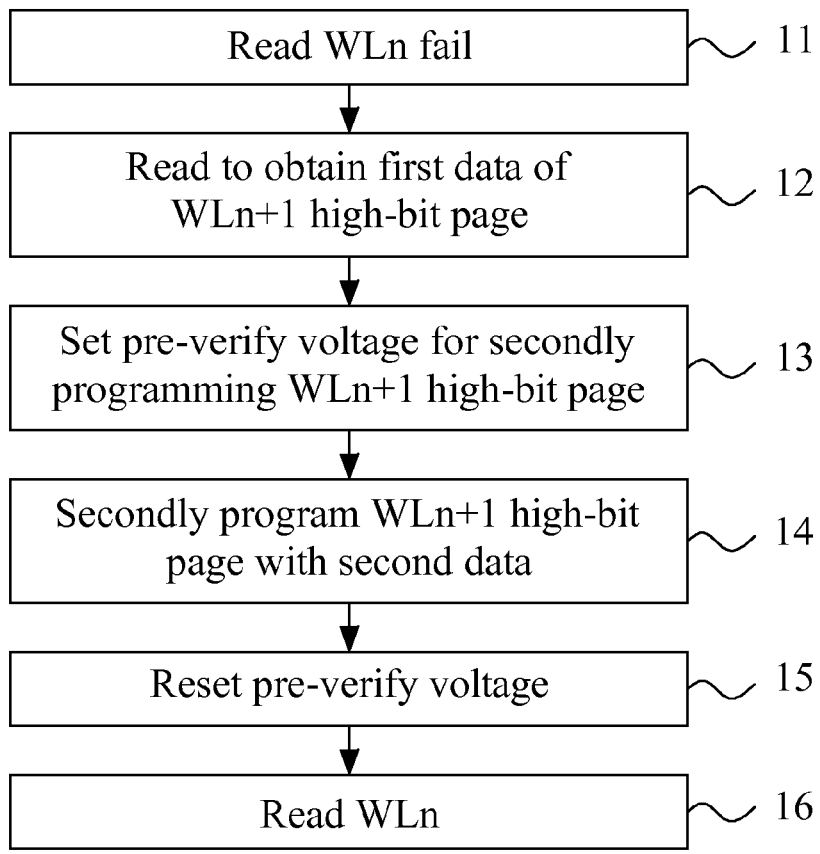
FIG. 1B shows a flow diagram of a method of programming a multi-bit per cell non-volatile memory for improving coupling effect according to a first embodiment of the present invention.

FIG. 1B shows a flow diagram of a method of programming a multi-bit per cell non-volatile memory for improving coupling effect according to a first embodiment of the present invention.

In step 11, data reading fails on an n-th word line WLn of the flash memory when the data cannot pass an error control Subsequently, in step 12, the flash memory is read to obtain a first data of a high-bit page (or most-significant-bit page or MSB page) on a following (n+1)-th word line WLn+1, which is assumed to succeed in data reading. Next, in step 13, at least one reference voltage (RV) such as a pre-verify voltage for secondly programming the high-bit page on the word line WLn+1 is set. Details of twice programming a non-volatile memory may be referred to in U.S. patent application Ser. No. 12/831,612, filed on Jul. 7, 2010, entitled "Method of Twice Programming a Non-Volatile Memory with a Sequence" assigned to the same assignee of the present application, the disclosure of which is hereby incorporated by reference. Afterwards, in step 14, the high-bit page on the word line WLn+1 is secondly programmed with a second data according to the pre-verify voltage that is set in step 13. In the embodiment, the second data is not the same as, and preferably is an inverse of, the first data. In the embodiment, the term "inverse" means that data bit of the first data is the opposite of the data bit of the second data. For example, the inverse of bit "1." is "0" and vice versa. According to the embodiment, the twice programming the high-bit page on the word line WLn+1 may substantially improve the coupling effect on the preceding word line WLn and thus increase its read margin. In step 15, the pre-verify voltage is reset to the pre-verify voltage prior the step 13. Finally, in step 16, the word line WLn, which fails the data reading in step 11, of the flash memory is read again. As the read margin on the n-th word line WLn is increased, data reading on the preceding word line WLn will succeed.

Figure 2A:
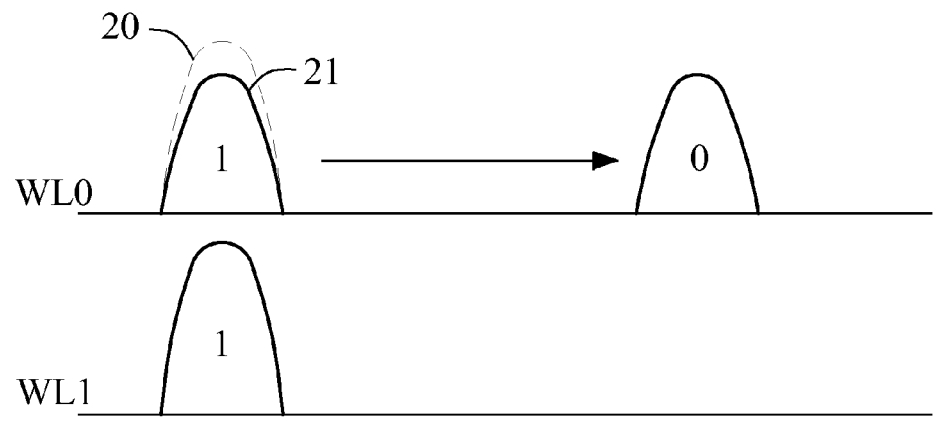
FIG. 2A to FIG. 2C show exemplary threshold voltage (VT) distributions on neighboring word lines WL0 and WL1 illustrative of coupling effect and coupling effect cancellation by twice programming.
Figure 2B:
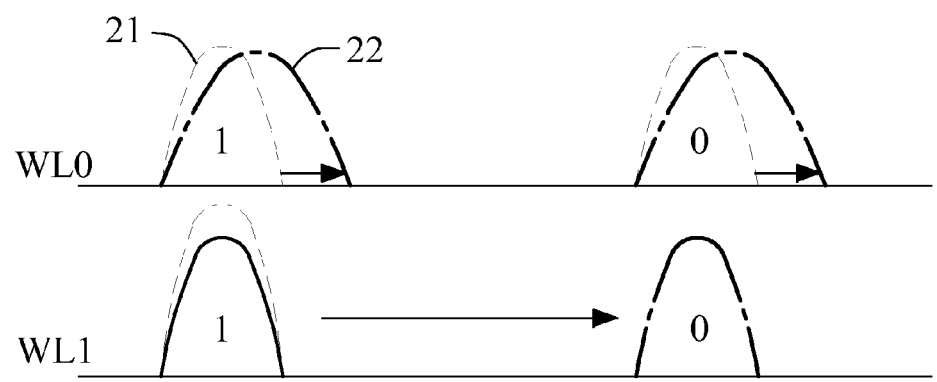
Figure 2C:
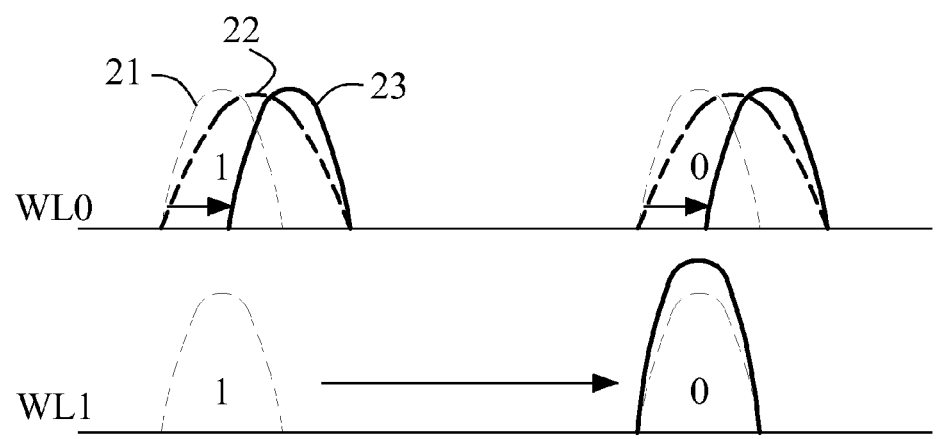

FIG. 2A to FIG. 2C show exemplary threshold voltage (VT) distributions on neighboring word lines WL0 and WL1 illustrative of coupling effect and coupling effect cancellation by twice programming. Specifically, FIG. 2A shows VT distributions after WL0 is programmed, where the curve 20 represents the VT distribution after erase and the curve 21 represents the VT distribution after WL0 is programmed. FIG. 2B shows VT distributions after WL1 is programmed. The programming WL1 incurs coupling effect on WL0, and thus makes the resultant distribution 22 on WL0 extended in range, thereby decreasing read margin for WL0. FIG. 2C shows VT distributions after WL1 is secondly programmed. The secondly programming WL1 makes the VT distribution 23 on WL0 decreased in range, thereby increasing the read margin for WL0. It is observed, that the resultant VT distribution 23 on WL0 has substantially the same, but shifted, VT distribution as the VT distribution 21 prior being affected by the coupling effect.

Figure 3:
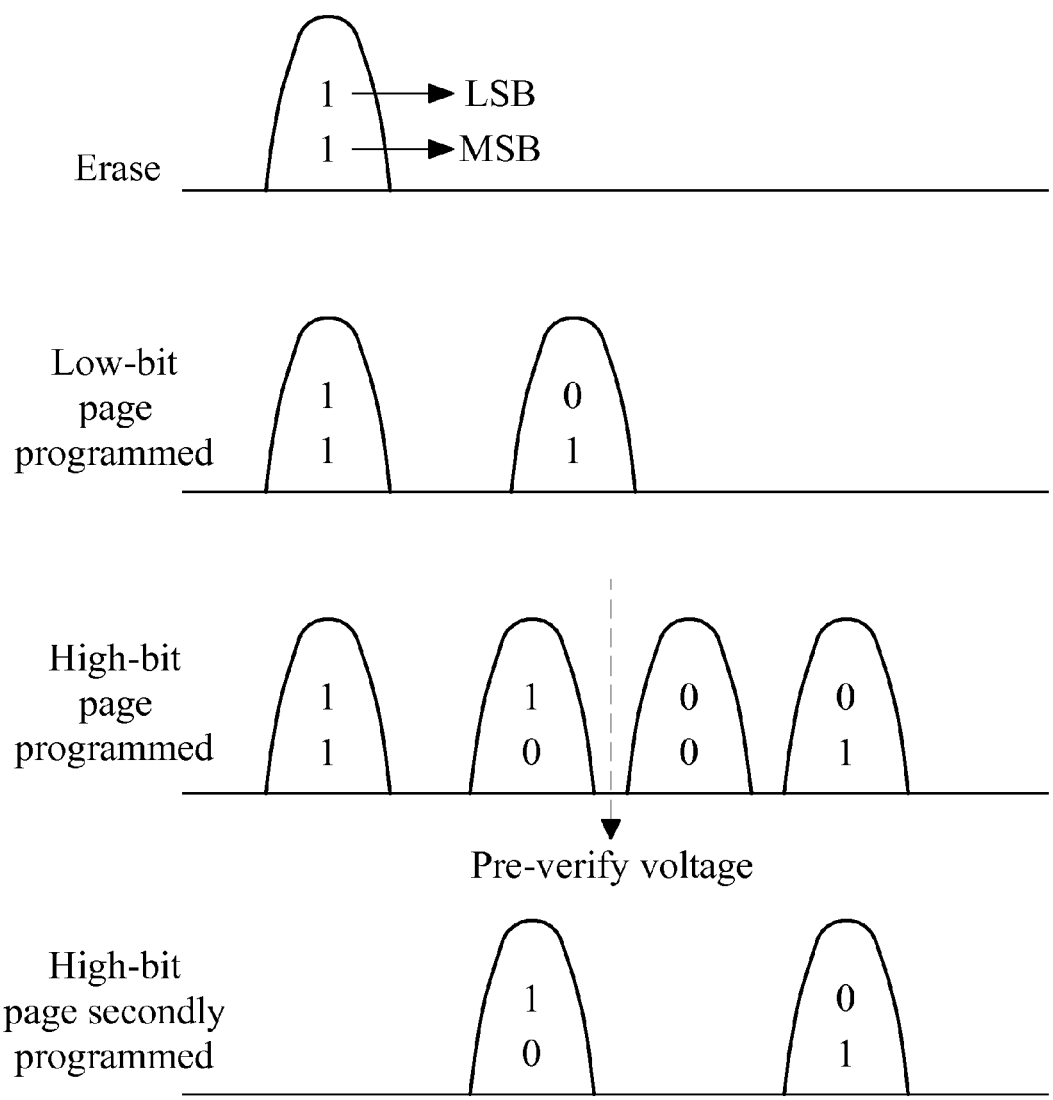
FIG. 3 shows exemplary threshold voltage distributions of a 2-bit per cell flash memory.

FIG. 3 shows exemplary threshold voltage distributions of a 2-bit per cell flash memory with respect to a state after erase, after programming a low-bit page, after programming a high-bit page and after secondly programming the high-bit page, respectively. Specifically, the high-bit page is secondly programmed with an inverse data according to a new pre-verify voltage.

Figure 4:
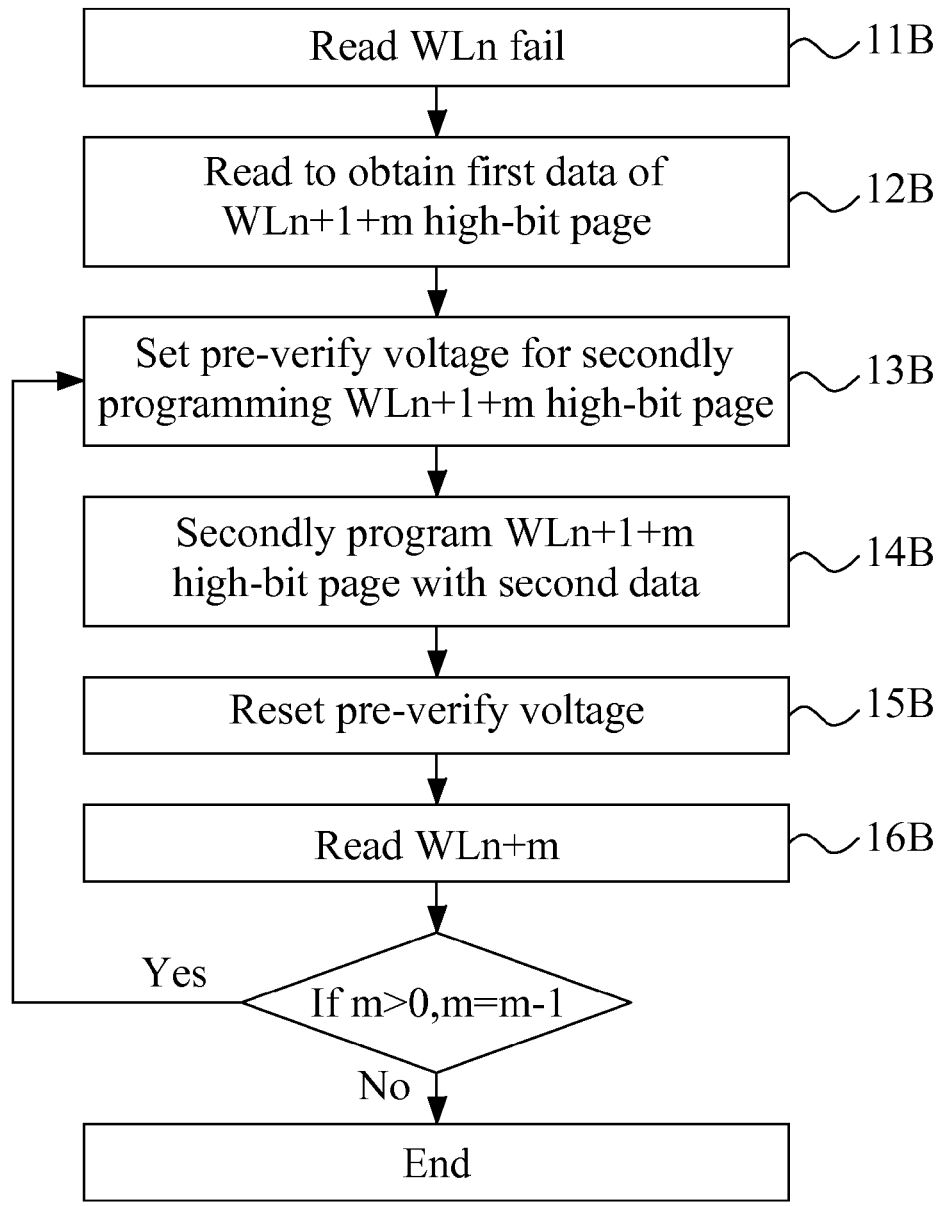
FIG. 4 shows a flow diagram of a method of programming a multi-bit per cell non-volatile memory for improving coupling effect according to an alternative embodiment of FIG. 1B.

FIG. 4 shows a flow diagram of a method of programming a multi-bit per cell non-volatile memory for improving coupling effect according to an alternative embodiment of FIG. 1B.

In step 11B, data readings fail on some word lines beginning at an n-th word line WLn of the flash memory. Subsequently, in step 12B, the flash memory is read to obtain a first data of the high-bit page on at least one word line that succeeds in data reading, such as the word lines WLn+1+m in FIG. 5A or the last word line WLn+1+m in FIG. 5B. Next, in step 13B, the pre-verify voltages for secondly programming the high-bit page on the word line WLn+1+m is set. Afterwards, in step 14B, the high-bit page on the word line WLn+1+m is secondly programmed with a second data according to the pre-verify voltage that is set in step 13B. In the embodiment, the second data is not the same as, and preferably is an inverse of, the first data. The first data preferably is a most-significant-bit (MSB) page data on the word line WLn+1+m. In step 15B, the pre-verify voltage is reset to the pre-verify voltage prior the step 13B. In step 16B, the word line WLn+m, which fails the data reading in step 11B, of the flash memory is read again. As the read margin on the word line WLn+m is increased due to secondly programming the word line WLn+1+m, data reading on the preceding word line WLn+m will succeed. Steps 13B to 16B are repeated until all the word lines that fail data readings are successfully re-read as shown in FIG. 5A or FIG. 5B. Further, the data read from the word line WLn+1+m, or plus additionally to read a data from the word line WLn+2+m, may be backup to other word lines before secondly programming the word line WLn+1+m.

FIG. 6 shows a program/read sequence in a memory block for a 2-bit per cell flash memory. FIG. 7A to FIG. 7C show exemplary threshold voltage distributions of a 2-bit per cell flash memory according to the program/read sequence shown in FIG. 6. Specifically, FIG. 7A shows the VT distributions at a time that a low-bit page on word line WLn+2 is programmed, followed by programming a high-bit page on word. WLn+1. Subsequently, as shown in FIG. 7B, the high-bit page on the word line WLn+1 is secondly programmed with inverse data, thereby increasing read margin on the word line WLn. Similarly, as shown in FIG. 7C, the high-bit page on the word line WLn is secondly programmed with inverse data, thereby increasing read margin on the word line WLn−1.

It is noted that, in some circumstances, the pre-verify voltage setting step 13/13B as discussed above may impossibly or unsuitably be performed. Accordingly, the embodiment as illustrated in FIG. 1B or FIG. 4 may be modified to accommodate this situation. FIG. 5A shows a flow diagram of a method of programming a multi-bit per cell non-volatile memory for improving coupling effect according to a second embodiment of the present invention. Specifically, in step 81, data reading fails on a current word line WLn of the flash memory when the data cannot pass an error control. Afterwards, in step 83, at least one neighbor word line is firstly programmed, for example, with random data that is randomly generated; uniformly distributed data that have 0s of the amount approximately equal to the amount of 1s; or same data of 0s or 1s. The at least one neighbor word line may be the word line(s) succeeding the word line WLn and/or the word line(s) preceding the word line WLn. Finally, in step 84, the word line WLn, which fails the data reading in step 81, of the flash memory is read again.

Figures 8A, 8B:
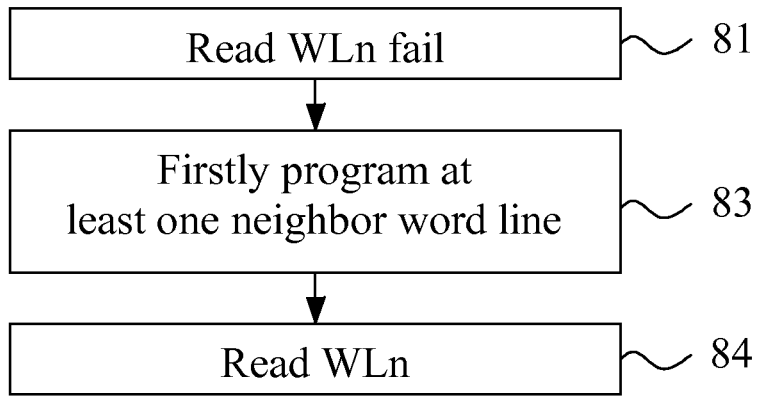
FIG. 8A shows a flow diagram of a method of programming a multi-bit per cell non-volatile memory for improving coupling effect according to a second embodiment of the present invention.
FIG. 8B shows an exemplary program sequence for a 3-bit per cell flash memory.

In a preferred embodiment, the page or pages to be firstly programmed in step 83 have program sequence numbers after the program sequence number of the failed page of the current word line WLn in step 81. FIG. 8B shows an exemplary program sequence for a 3-bit per cell flash memory. It is assumed that pages 0-6 have been programmed, and data reading fails on a center-significant bit (CSB) page (i.e., page 4) of word line 1. In order to improve the coupling effect, the CSB page (i.e., page 7) having the program sequence number after the page 4, on the succeeding word line WL2 is firstly programmed. In another example, it is assumed that pages 0-6 have been programmed, and data reading fails on an MSB page (i.e., page 5) of word line 0. In order to improve the coupling effect, an MSB page (i.e., page 8) on the succeeding word line WL1 may be firstly programmed. Alternatively, page 7 and page 8 on the succeeding word lines WL1 and WL2 may be firstly programmed to improve the coupling effect. In a further example, it is assumed that pages 0-7 have been programmed, and data reading fails on a CSB page (i.e., page 7) of word line 2. In order to improve the coupling effect, the MSB page (i.e., page 8) having the program sequence number after the page 7, on the preceding word line WL1 is firstly programmed.

Figure 8C:
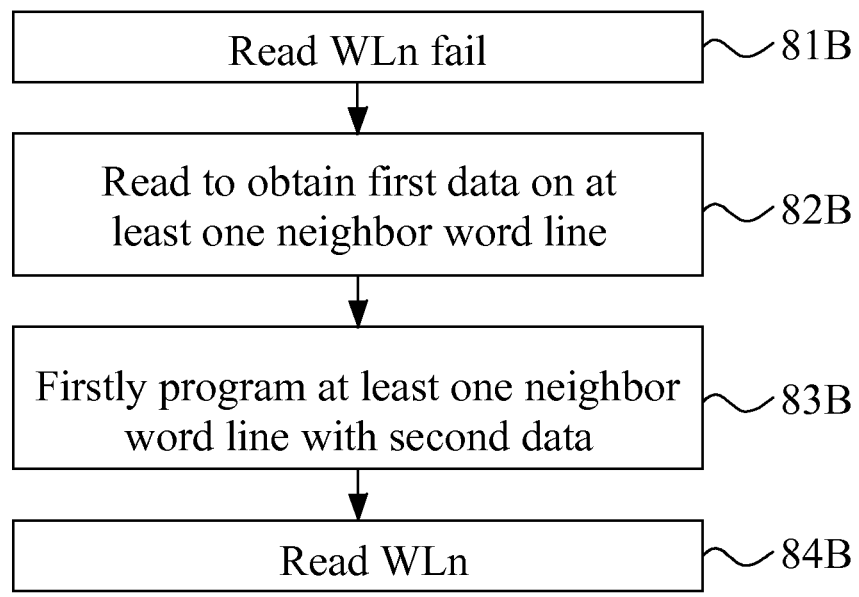
FIG. 8C shows a flow diagram of a method of programming a multi-bit per cell non-volatile memory for improving coupling effect according to an alternative embodiment of FIG. 8A.

FIG. 8C shows a flow diagram of a method of programming a multi-bit per cell non-volatile memory for improving coupling effect according to an alternative embodiment of FIG. 8A. Specifically, in step 81B, data reading fails on a current word line WLn of the flash memory when the data cannot pass an error control. Subsequently, in step 82B, the flash memory is read to obtain a first data of a less-significant-bit page (e.g., low-bit page or least-significant-bit (LSB) page) or a center-significant bit (CSB) page on at least one neighbor word line. Generally, the first data is read from a page has been programmed on the at least one neighbor word line. Afterwards, in step 83B, one page of the at least one neighbor word line is firstly programmed with a second data that is different from the first data. In one embodiment, the second data is an inverse of the first data; in another embodiment, the second data is random data, uniformly distributed data or same data. Finally, in step 84B, the word line WLn, which fails the data reading in step 81B, of the flash memory is read again.

Figure 9B:
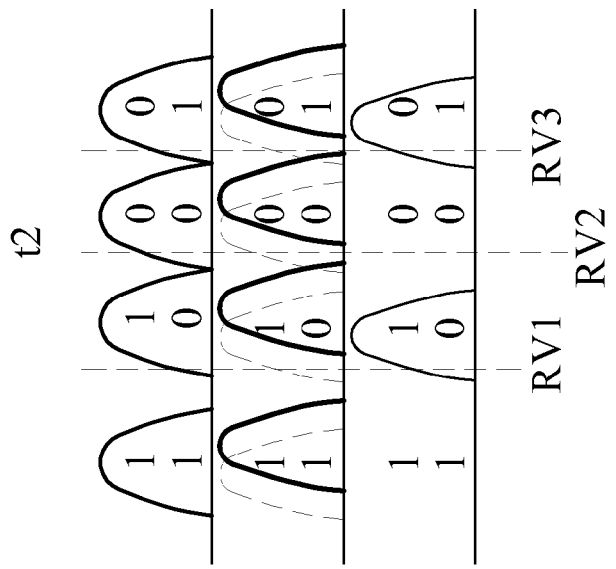
FIG. 9A and FIG. 9B show exemplary threshold voltage distributions without using the pre-verify voltage.
Figure 9A:
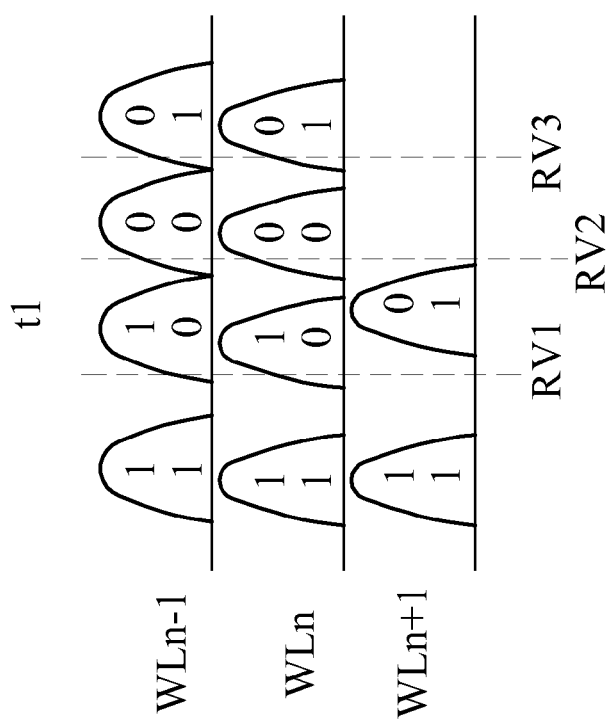

FIG. 9A and FIG. 9B show exemplary threshold voltage distributions without using the pre-verify voltage. Specifically, as shown in FIG. 9A, the high-bit page on word line WLn+1 is programmed with specific data, e.g., inverse data, that is capable of improving the coupling effect on the preceding word line assumed being not the last word line of a physical block, as shown in FIG. 9B. In case that the word line WLn is the last word line of the physical block, the high-bit page on word line WLn−1 is programmed instead.

Figure 9D:
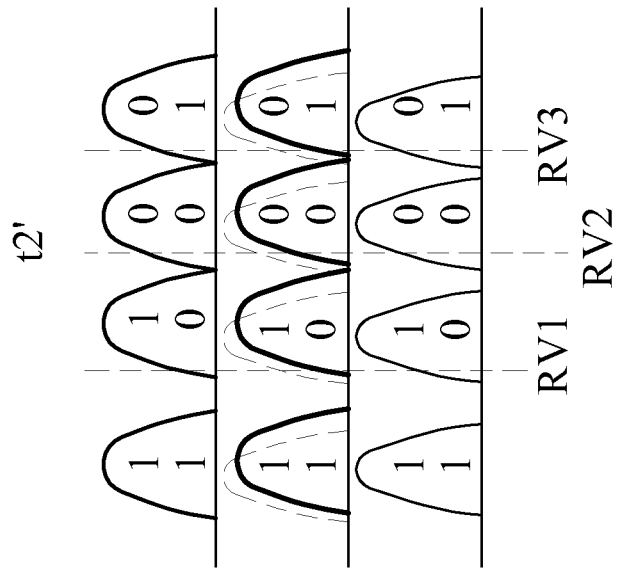
FIG. 9C and FIG. 9D show some other exemplary threshold voltage distributions without using the pre-verify voltage.
Figure 9C:
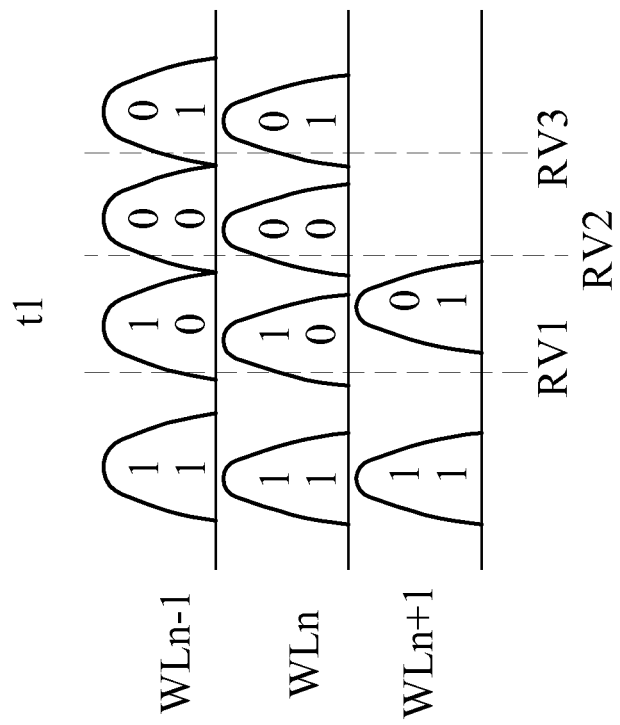

FIG. 9C and FIG. 9D show some other exemplary threshold voltage distributions without using the pre-verify voltage. The VT distributions of FIGS. 9C and 9D are similar to those of FIGS. 9A and 91B, with the distinctness that the high-bit page on word line WLn+1 is programmed with random data. The modified embodiment according to FIGS. 9C and 9D may improve the coupling effect but with performance not good as that according to FIGS. 9A and 9B.

Figure 10:
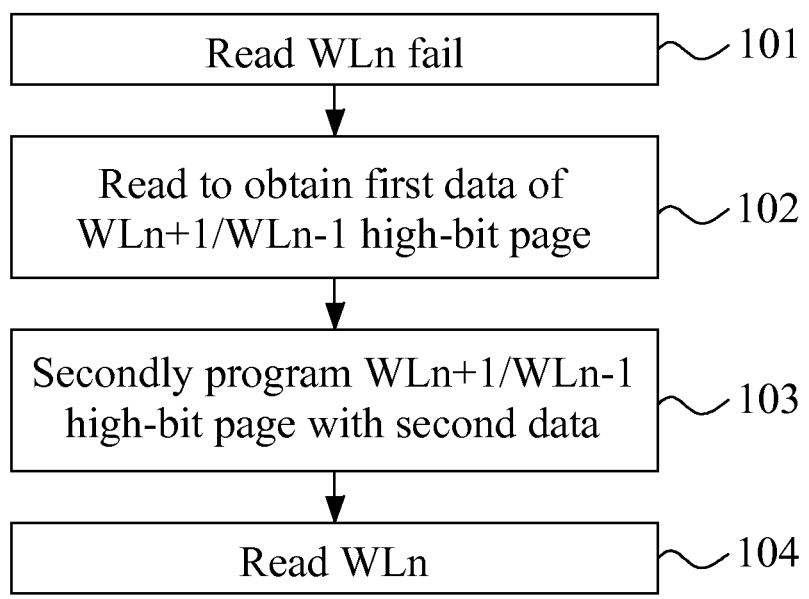
FIG. 10 shows a flow diagram of a method of programming a multi-bit per cell non-volatile memory for improving coupling effect according to a third embodiment of the present invention.

FIG. 10 shows a flow diagram of a method of programming a multi-bit per cell non-volatile memory for improving coupling effect according to a third embodiment of the present invention. Specifically, in step 101, data reading fails on a current word line WLn of the flash memory when the data cannot pass an error control. Subsequently, in step 102, the flash memory is read to obtain a first data of a most-significant-bit (MSB) page (e.g., high-bit page) on at least one neighbor word line. In the embodiment, the neighbor word line is the succeeding word line WLn+1 if the current word line WLn is not the last word line of a physical block; otherwise, the neighbor word line is the preceding word line WLn− 1. Afterwards, in step 103, the high-bit page on the at least one neighbor word line WLn+1/WLn−1 is secondly programmed with a second data that is different from the first data. In one embodiment, the second data is an inverse of the first data; in another embodiment, the second data is random data, uniformly distributed data or same data. Finally, in step 104, the word line WLn, which fails the data reading in step 101, of the flash memory is read again.

Although specific embodiments have been illustrated and described, it will be appreciated by those skilled in the art that various modifications may be made without departing from the scope of the present invention, which is intended to be limited solely by the appended claims.

What is claimed is:

1. A method of programming a multi-bit per cell non-volatile memory, comprising the following steps performed in order:
(A) reading data on a current word line on which data reading fails;
(B) reading to obtain a first data from a page has been programmed on the at least one neighbor word line, wherein the first data is different from the data with which the neighbor word line is programmed; and
(C) programming one page of at least one neighbor word line that is neighboring to the current word line.

2. The method of claim 1, wherein the non-volatile memory is a flash memory, a phase change memory (PCM) or an electrically erasable programmable read-only memory (EEPROM).

3. The method of claim 1, wherein the first data is read from a less-significant-bit (LSB) page or a center-significant bit (CSB) page on the at least one neighbor word line.

4. The method of claim 3, wherein the data with which the page of the neighbor word line is programmed is an inverse of the first data.

5. The method of claim 1, wherein the one page of the at least one neighbor word line is programmed with random data, uniformly distributed, data or same data.

6. A method of programming a multi-bit per cell non-volatile memory, comprising the following steps performed in order:
(A) reading data on a current word line on which data reading fails;
(B) reading one page on at least one neighbor word line to obtain the first data; and
(C) secondly programming said one page with a second data on the at least one neighbor word line, the second data being different from the first data.

7. The method of claim 6, wherein the neighbor word line follows the current word line when the current word line is not a last word line of a physical block of the nonvolatile memory; and the neighbor word line precedes the current word line when the current word line is the last word line of the physical block of the non-volatile memory.

8. The method of claim 6, wherein the second data is an inverse of the first data.

9. The method of claim 6, wherein the second data is random data, uniformly distributed data or same data.

10. The method of claim 6, wherein the first data is read from a most-significant-bit (MSB) page on the at least one neighbor word line.

11. The method of claim 6, wherein the second data is secondly programmed in a most-significant-bit (MSB) page on the at least one neighbor word line.

* * * * *